(12) United States Patent
Anand et al.

(10) Patent No.: US 7,088,962 B2
(45) Date of Patent: Aug. 8, 2006

(54) ON-CHIP LOOP FILTER FOR A PLL

(75) Inventors: Seema B. Anand, Beverly Hills, CA (US); Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 413 days.

(21) Appl. No.: 10/727,371

(22) Filed: Dec. 4, 2003

(65) Prior Publication Data

US 2005/0124309 A1   Jun. 9, 2005

(51) Int. Cl.
    H04B 1/40   (2006.01)
    H04B 1/06   (2006.01)
    H04B 7/00   (2006.01)

(52) U.S. Cl. ............... 455/76; 455/260; 333/172; 375/376

(58) Field of Classification Search ........... 455/76, 455/118, 255–260, 307; 375/374, 376; 331/1 R, 331/25; 333/172; 327/156–157, 551–552
See application file for complete search history.

(56) References Cited

U.S. PATENT DOCUMENTS 4,736,167 A * 4/1988 Kojima et al. ............ 331/17
6,115,586 A * 9/2000 Bezzam et al. ............ 455/112
6,522,223 B1 * 2/2003 Lobl et al. .................. 333/172

* cited by examiner

Primary Examiner—Nguyen T. Vo
(74) Attorney, Agent, or Firm—Garlick Harrison & Markison; Timothy W. Markison (57) ABSTRACT

An on-chip loop filter includes a $1^{st}$ resistor, a $1^{st}$ capacitor, a $2^{nd}$ capacitor, a $3^{rd}$ capacitor, a $2^{nd}$ resistor, and a $4^{th}$ capacitor. The $1^{st}$ resistor is operably coupled to receive a charge pump output. The $1^{st}$ capacitor is coupled in series with the $1^{st}$ resistor where the second node of the $1^{st}$ capacitor is coupled to a return. The $2^{nd}$ capacitor is coupled in parallel with the series combination of the $1^{st}$ resistor and $1^{st}$ capacitor. The $3^{rd}$ capacitor is coupled in parallel with the $2^{nd}$ capacitor. The $2^{nd}$ resistor is coupled to a node of the $3^{rd}$ capacitor and to a node of the $4^{th}$ capacitor. The other node of the $4^{th}$ capacitor is coupled to ground. To enable these components to be placed on-chip, the $1^{st}$ capacitor is of a $1^{st}$ capacitor construct having a $1^{st}$ quality factor, the $2^{nd}$ capacitor is of a $2^{nd}$ capacitor construct having a $2^{nd}$ quality factor, where the $2^{nd}$ quality factor is greater than the $1^{st}$ quality factor, and the $3^{rd}$ and $4^{th}$ capacitors are of a $3^{rd}$ capacitor construct having a $3^{rd}$ quality factor, which is greater than the $2^{nd}$ quality factor.

30 Claims, 4 Drawing Sheets

FIG. 3
local oscillation module 74

FIG. 4
phase locked loop 100

FIG. 5
loop filter 110

FIG. 8
first construct
wide channel transistor

FIG. 7
second construct
narrow channel transistor

FIG. 6
third construct
metal fringe capacitor

ON-CHIP LOOP FILTER FOR A PLL

BACKGROUND OF THE INVENTION

1. Technical Field of the Invention

This invention relates generally to wireless communication devices and more particularly to phase locked loops.

2. Description of Related Art

CMOS (complimentary metal oxide semiconductor) technology has enabled the integration of very complex circuitry into very small integrated circuit packages. However, some components must remain off-chip due to the precision needed, value flexibility needed, and/or the excessive die area required to implement the component on-chip. For instance, components of a loop filter of a local oscillation generator (which includes a phase locked loop) used in radio frequency integrated circuits by both the transmit and receive sections are off-chip. While the off-chip components allow for greater flexibility in value selection, greater precision, and/or die area savings, it comes at the cost of pin count and increased noise.

As is known, at radio frequency (RF) frequencies (e.g., in the gigahertz), coupling between integrated circuits and external components via pins and board traces adds unwanted parasitics (e.g., inductance and capacitance) to the loop filter that adversely effect the performance of the local oscillation generator and hence adverse effects the overall performance of the radio frequency integrated circuit.

Therefore, a need exists for an on-chip loop filter for use within a local oscillation generator that provides similar advantages as off-chip components and minimizes the disadvantages.

BRIEF SUMMARY OF THE INVENTION

The on-chip loop filter for a phase locked loop (PLL) of the present invention substantially meets these needs and others. In one embodiment, an on-chip loop filter includes a $1^{st}$ resistor, a $1^{st}$ capacitor, a $2^{nd}$ capacitor, a $3^{rd}$ capacitor, a $2^{nd}$ resistor, and a $4^{th}$ capacitor. The $1^{st}$ resistor is operably coupled to receive a charge pump output. The $1^{st}$ capacitor is coupled in series with the $1^{st}$ resistor where the second node of the $1^{st}$ capacitor is coupled to a return. The $2^{nd}$ capacitor is coupled in parallel with the series combination of the $1^{st}$ resistor and $1^{st}$ capacitor. The $3^{rd}$ capacitor is coupled in parallel with the $2^{nd}$ capacitor. The $2^{nd}$ resistor is coupled to a node of the $3^{rd}$ capacitor and to a node of the $4^{th}$ capacitor. The other node of the $4^{th}$ capacitor is coupled to ground. To enable these components to be placed on-chip, the $1^{st}$ capacitor is of a $1^{st}$ capacitor construct having a $1^{st}$ quality factor, the $2^{nd}$ capacitor is of a $2^{nd}$ capacitor construct having a $2^{nd}$ quality factor, where the $2^{nd}$ quality factor is greater than the $1^{st}$ quality factor, and the $3^{rd}$ and $4^{th}$ capacitors are of a $3^{rd}$ capacitor construct having a $3^{rd}$ quality factor, which is greater than the $2^{nd}$ quality factor. For example, the $3^{rd}$ and $4^{th}$ capacitors may be metal capacitors, the $2^{nd}$ capacitor may be one or more narrow channel transistor capacitors, and the $1^{st}$ capacitor may be one or more wide channel transistor capacitors. By creating an on-chip loop filter for a phase locked loop, which may be used in a local oscillation generator, the pin requirement for a radio frequency integrated circuit is reduced as well as the corresponding noise for interfacing with external components.

DETAILED DESCRIPTION OF THE INVENTION

Figure 1:
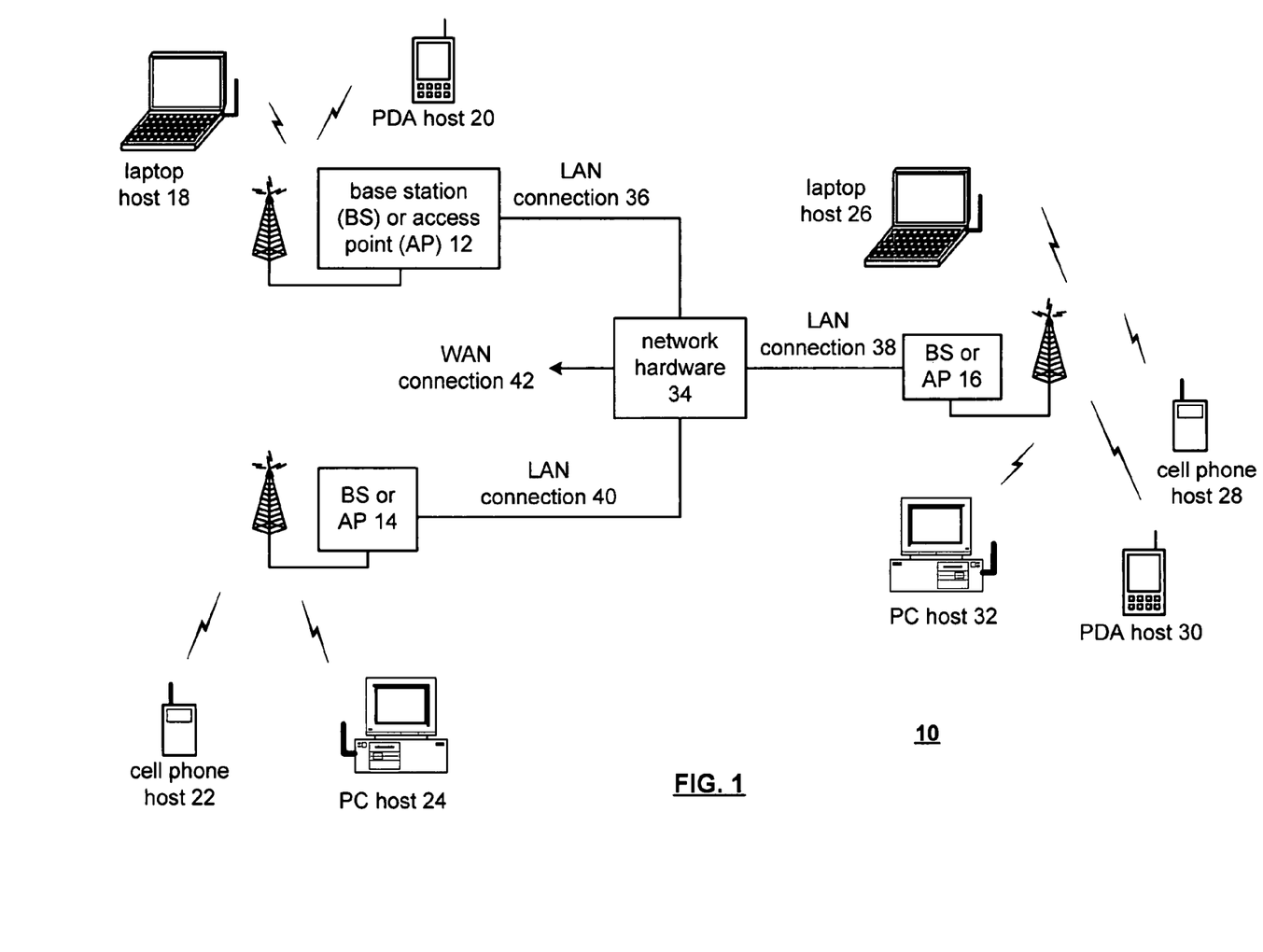
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
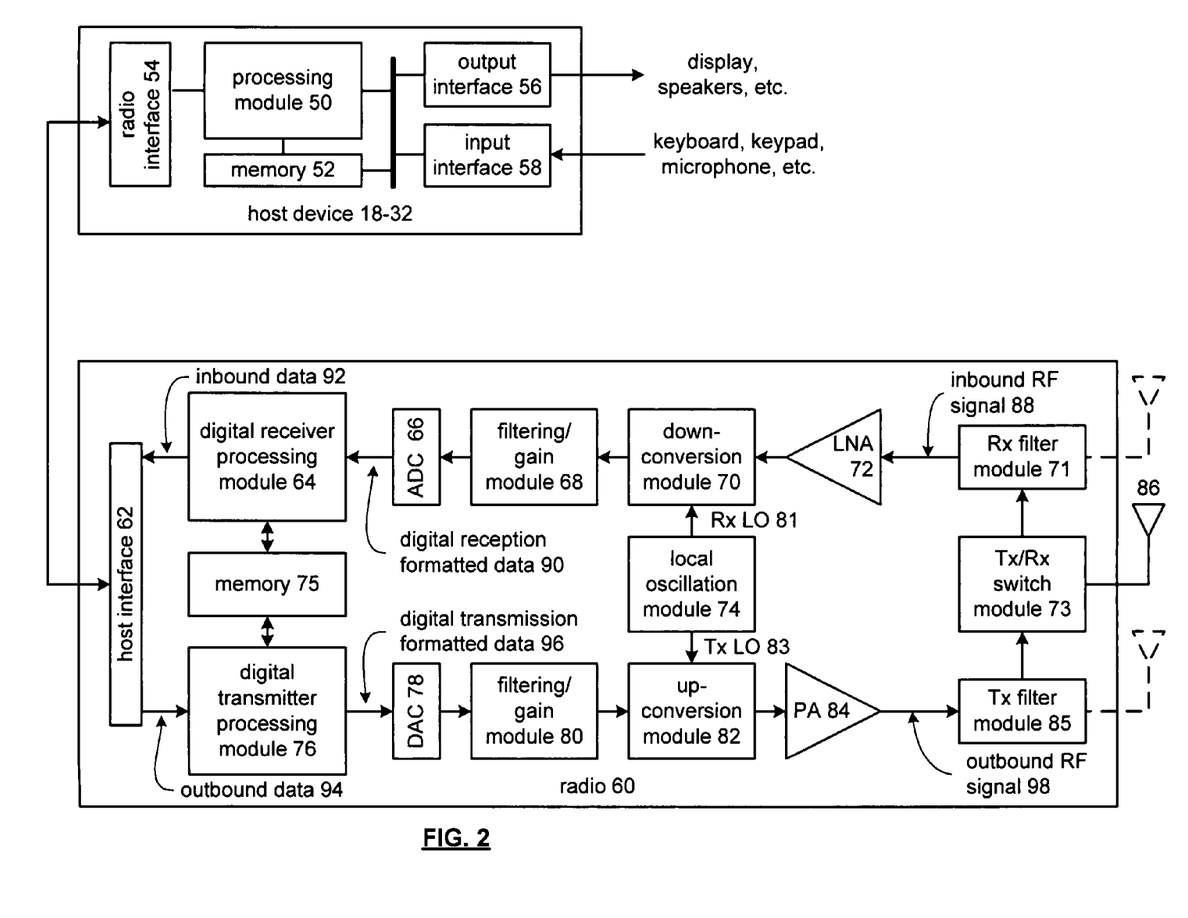
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
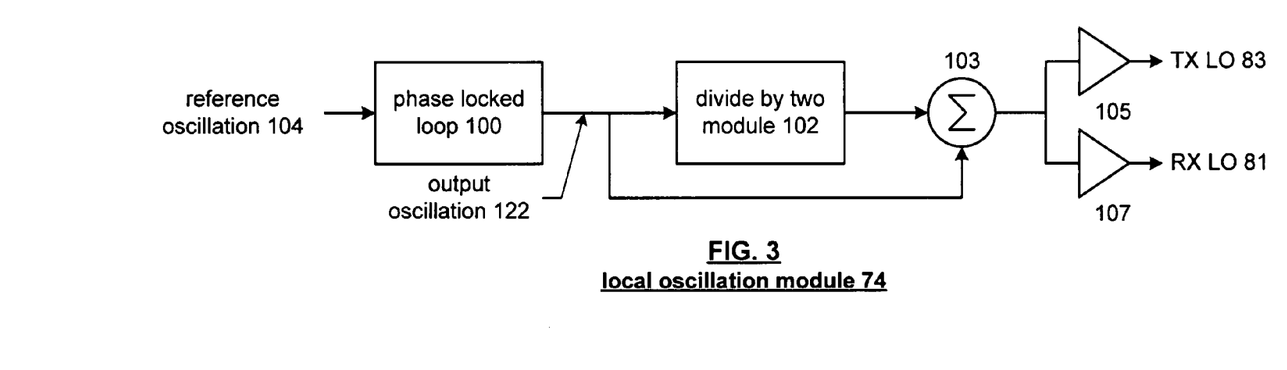
FIG. 3 is a schematic block diagram of a local oscillation module in accordance with the present invention.

FIG. 3 is a schematic block diagram of a local oscillation module 74 that includes a phase locked loop 100, a divide-by-two module 102, a summation module 103 and two output buffers 105 and 107. The phase locked loop 100 receives a reference oscillation 104 that it converts into an output oscillation 122. The reference oscillation 124 may be generated by a crystal oscillator that produces a 10–25 megahertz signal. The frequency of the output oscillation 122 is dependent on the desired frequency of the transmit local oscillation 83 and the receive local oscillation 81. For example, if the desired transmit and receive local oscillations 81 and 83 is 2.4 gigahertz, the output oscillation 122 will be 1.6 gigahertz (i.e., two-thirds of the desired local oscillation such that when it is summed with one-half of its frequency, i.e., one-third of the desired local oscillation, the resulting oscillation is at the desired rate).

The divide-by-two module 102 divides the frequency of the output oscillation 122 by two. In the previous example, the divide-by-two module 102 will produce a clock signal having a frequency of 800 megahertz. The summation module 103 sums the output oscillation 122 with the output produced by the divide-by-two module 102 to produce the desired local oscillation. For instance, with the 2.4 gigahertz local oscillation example, the output oscillation 122 has a frequency of 1.6 gigahertz, the output of the divide-by-two module has a frequency of 0.8 gigahertz, when summed together the 2.4 gigahertz is achieved. As one of average skill in the art will appreciate, the transmit local oscillation 83 on the receive local oscillation 81 may include an in-phase component and a quadrature component.

Figure 4:
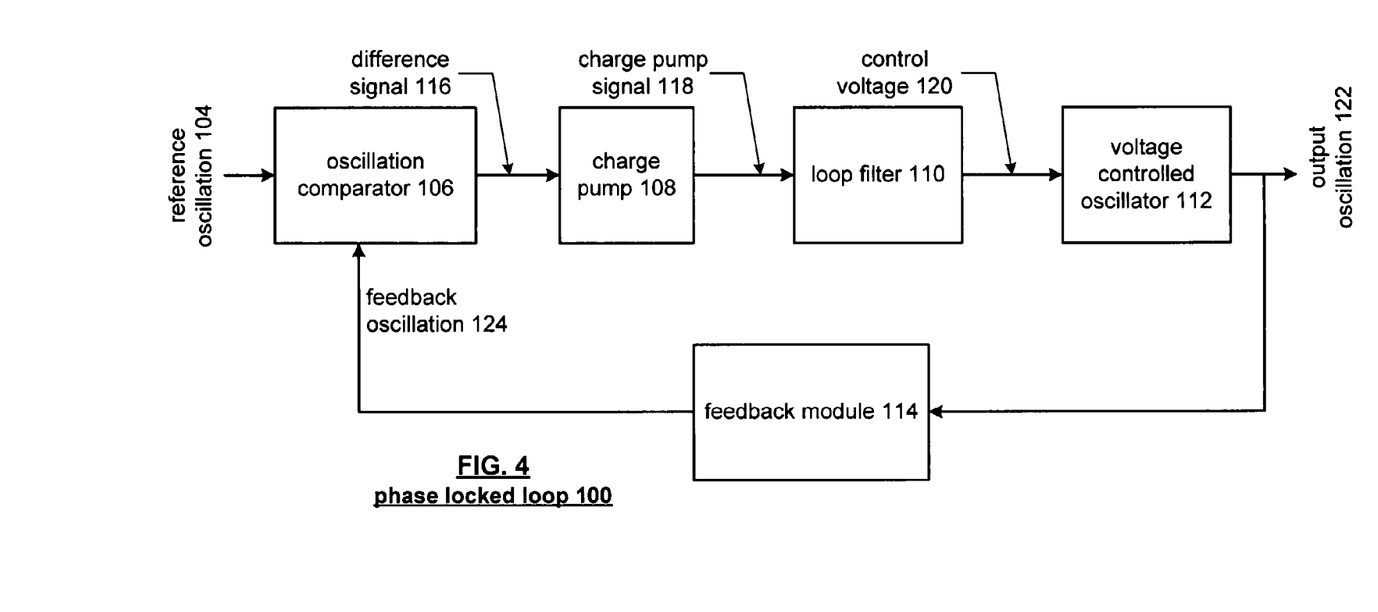
FIG. 4 is a schematic block diagram of a phase locked loop in accordance with the present invention.

FIG. 4 is a schematic block diagram of a phase locked loop 100 that includes an oscillation comparator 106, a charge pump 108, a loop filter 110, a voltage controlled oscillator 112, and a feedback module 114. The oscillation comparator 106 may be a phase comparator or a phase and frequency comparator. The oscillation comparator 106 compares the phase and/or frequency differences between the reference oscillation 104 and a feedback oscillation 124. The feedback oscillation 124 is generated by the feedback module 114, which divides the frequency of the output oscillation 122 by a divider value. For example, if the reference oscillation 104 is a 20 megahertz signal and the output oscillation 122 is 1.6 gigahertz, the divider value will be 80, which produces a feedback oscillation 124 of 20 megahertz.

The charge pump 108 receives the difference signal 116 from the oscillation comparator 106 and generates a corresponding charge pump signal 118. In one embodiment, the charge pump 108 may be a current charge pump that produces a positive current when the frequency of the output oscillation 122 needs to be increased and/or the phase offset of the output oscillation 122, with respect to the reference oscillation, needs to be decreased. Conversely, if the output oscillation 122 has a leading phase or is at a too high of a frequency, the charge pump produces a negative current that slows the frequency of the output oscillation 122 and/or increases the phase offset of the output oscillation 122.

The loop filter 110 converts the charge pump signal 118 into a control voltage 120 that is provided to the voltage controlled oscillator 112. The voltage controlled oscillator 112, based on the control voltage 120, produces the output oscillation 122. For instance, as the control voltage increases, which it does so with a positive current charge pump signal 118, the frequency of the output oscillation increases and/or the phase offset decreases. Conversely, as the control voltage 120 decreases, the frequency of the output oscillation 122 decreases and the phase offset increases.

Figure 5:
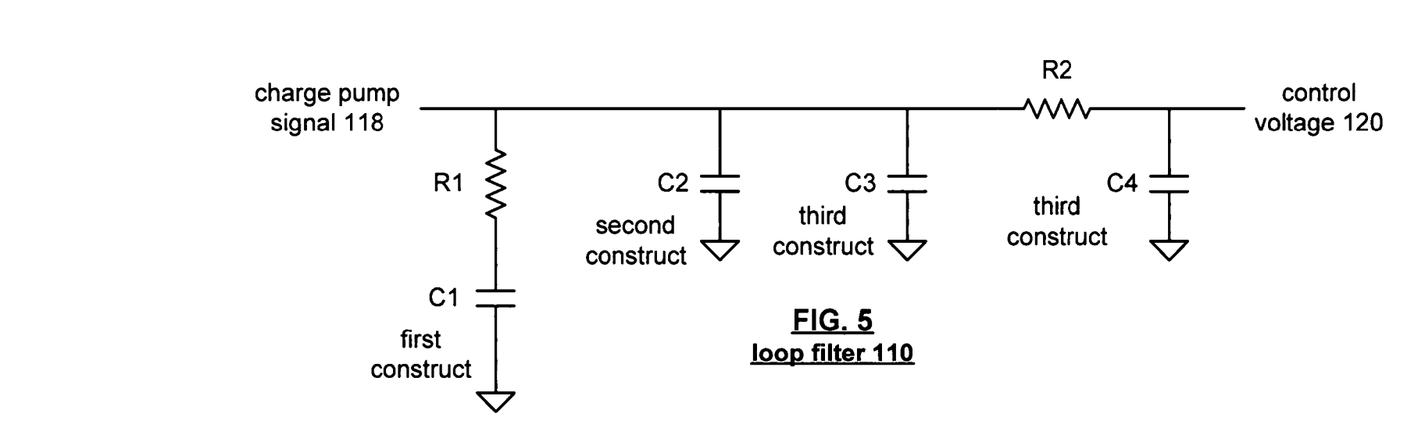
FIG. 5 is a schematic block diagram of an on-chip loop filter in accordance with the present invention.
Figure 8:
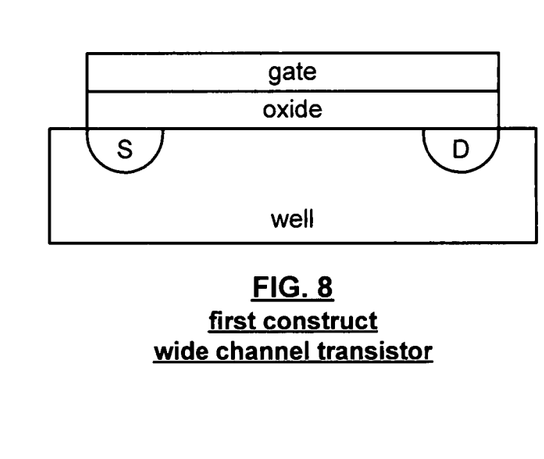
FIG. 8 is a graphical representation of a $3^{rd}$ capacitor construct in accordance with the present invention.

FIG. 5 is a schematic block diagram of loop filter 110 that includes a $1^{st}$ resistor (R1), a $1^{st}$ capacitor (C1), a $2^{nd}$ capacitor (C2), a $3^{rd}$ capacitor (C3), a $2^{nd}$ resistor (R2), and a $4^{th}$ capacitor (C4). The $1^{st}$ capacitor C1 is of a $1^{st}$ capacitor construct which is illustrated in FIG. 8. As shown in FIG. 8, the $1^{st}$ capacitor construct is a wide channel transistor. To produce a capacitor from a transistor, the drain (D) is electrically coupled to the source (S) of the transistor. In this embodiment, the distance between the source and drain is relatively wide thus producing a relatively large capacitance value in a relatively small die area, however, the quality factor (Q) is relatively low. For instance, in one embodiment, the $1^{st}$ capacitor may have a capacitance value of 2.2 nano farads (+ or –20%) with a quality factor of approximately 30. Note that the $1^{st}$ capacitor may include one or more wide channel transistors configured as a capacitor to achieve the desired capacitance. In furtherance of this example, resistor R1 may have a resistance value of 4.7 kilo-Ohms.

Figure 7:
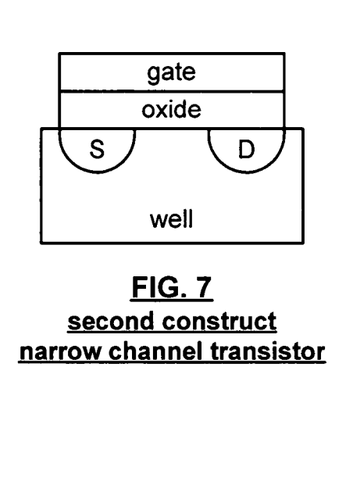
FIG. 7 is a graphical representation of a $2^{nd}$ capacitor construct in accordance with the present invention.

The $2^{nd}$ capacitor C2 is of a $2^{nd}$ capacitor construct as illustrated in FIG. 7. The $2^{nd}$ capacitor construct is a narrow channel transistor that includes a drain and source within a well, where the drain and source are relatively close to each other. This type of capacitor structure, when the drain and source are coupled together, produce a capacitor having a higher quality factor than that of the $1^{st}$ capacitor construct (e.g., Q approximately 100) but also produces a smaller capacitance value per die area. In continuation with the example above, the $2^{nd}$ capacitor may have a capacitance value of 150 pico-farads and may include one or more narrow channel transistors to achieve the desired capacitance value.

Figure 6:
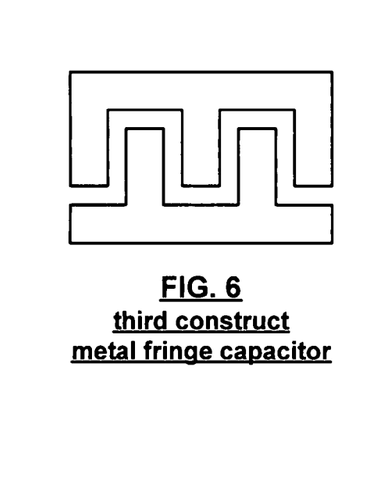
FIG. 6 is a geometric representation of a $1^{st}$ construct capacitor in accordance with the present invention.

The $3^{rd}$ and $4^{th}$ capacitors are of the $3^{rd}$ capacitor construct which is illustrated in FIG. 6. As shown in FIG. 6, the $3^{rd}$ capacitor construct is a metal fringe, or finger, capacitor that includes metal plates fabricated on one or more metal layers of an integrated circuit. Such a capacitor produces precision capacitors (e.g., capacitance values having a tolerance of approximately 5%) and a high quality factor (Q approximately equal to 200) but consumes a relatively large die area per capacitance value. As such, it is desired that the capacitance value of the $3^{rd}$ and $4^{th}$ capacitors be relatively small. Continuing with the above example, the $3^{rd}$ capacitor may have a capacitance value of 50 pico-farads and the $4^{th}$ capacitor may have a capacitance value of 20 pico-farads. Continuing with this example, the $2^{nd}$ resistor may have a resistance value of 200 Ohms.

To facilitate the desired noise immunity, the $2^{nd}$ resistor R2 and the $4^{th}$ capacitor C4 should be placed near the input of the voltage controlled oscillator 112. In addition, capacitor C2 and C3 may be stacked on top of each other on different metal layers. Further, resistors R1 and R2 and capacitors C1–C3 may have a ground plane underneath them to enhance shielding. Further, one or more of the resistors R1 and R2 may be variable as well as one or more of capacitors C1–C4. If variable components are used, an RC calibration circuit may be included to tune the values of the variable resistors and/or capacitors.

By placing R2 and C4 in layout near the inputs of the VCO, which may include on-chip inductors that have a relatively low quality factor (e.g., less than 20), the desired loop filtering is achieved on-chip. As such, the need for pins to couple to external components is eliminated as well as the associated noise produced as a result of the external coupling.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an on-chip loop filter for use within a phase locked loop, which in turn may be used within a local oscillation generator. By implementing an on-chip loop filter, the adverse effects of external components is substantially reduced while with the varied construct of the loop filter, the advantages are substantially maintained. As one of average skill in the art will appreciate, other embodiments may be derived from the teaching of the present invention without deviating from the scope of the claims.

What is claimed is:

1. An on-chip loop filter for a phase locked loop, the on-chip filter comprises:
   a first resistor having a first node and a second node, wherein the first node is operably coupled to receive a charge pump output;
   a first capacitor having a first node and a second node, wherein the first node of the first capacitor is operably coupled in series with the second node of the first resistor, wherein the second node of the first capacitor is coupled to a return, wherein the first capacitor is of a first capacitor construct having a first quality factor;
   a second capacitor operably coupled in parallel to the series connection of the first resistor and the first capacitor, wherein the second capacitor is of a second capacitor construct having a second quality factor, wherein the second quality factor is greater than the first quality factor;
   a third capacitor operably coupled in parallel with the second capacitor, wherein the third capacitor is of third capacitor construct having a third quality factor, wherein the third quality factor is greater than the second quality factor;
   a second resistor having a first node and a second node, wherein the first node of the second resistor is operably coupled to the first node of the first resistor; and
   a fourth capacitor having a first node and a second node, wherein the first node of the fourth capacitor is coupled to the second node of the second resistor to provide a control voltage, wherein the second node of the fourth capacitor is coupled to the return, wherein the fourth capacitor is of the third capacitor construct having the third quality factor.

2. The on-chip loop filter of claim 1 further comprises:
   the first capacitor having a first die area to capacitance ratio;
   the second capacitor having a second die area to capacitance ratio; and
   the third capacitor and fourth capacitors have a third die area to capacitance ratio, wherein the third die area to capacitance ratio is greater than the second die area to capacitance ratio, which is greater than the first die area to capacitance ratio.

3. The on-chip loop filter of claim 1 further comprises at least one of:
   the first resistor including a variable resistance structure; and
   the second resistor including a second variable resistance structure.

4. The on-chip loop filter of claim 1 further comprises at least one of:
   the first capacitor including a variable capacitive structure;
   the second capacitor including a second variable capacitive structure;
   the third capacitor including a third variable capacitive structure; and
   the fourth capacitor including a fourth variable capacitive structure.

5. The on-chip loop filter of claim 1, wherein the third capacitor construct comprises a metal fringe capacitor structure.

6. The on-chip loop filter of claim 1, wherein the second capacitor construct comprises a plurality of MOS (Metal Oxide Semiconductor) transistors, wherein each of the plurality of MOS transistors has a narrow channel length.

7. The on-chip loop filter of claim 1, wherein the third capacitor construct comprises a plurality of MOS (Metal Oxide Semiconductor) transistors, wherein each of the plurality of transistors has a wide channel length.

8. The on-chip loop filter of claim 1 further comprises:
   the second capacitor fabricated on a first metal layer; and
   the third capacitor fabricated on a second metal layer, wherein the second capacitors substantially overlays the third capacitor.

9. The on-chip loop filter of claim 1 further comprises:
   a ground plane fabricated to shield the first resistor, the first capacitor, the second capacitor, and the third capacitor.

10. The on-chip loop filter of claim 1 further comprises:
    the second resistor and the fourth capacitor fabricated proximal to an input of a voltage controlled oscillator.

11. An on-chip phase locked loop comprises:
    an oscillation comparator operably coupled to compare a reference oscillation with a feedback oscillation to determine at least one of a phase difference and a frequency difference;
    a charge pump operably coupled to convert the at least one of the phase difference and the frequency difference into a charge pump signal;
    a loop filter operably coupled to convert the charge pump signal into a control voltage;

a voltage controlled oscillator operably coupled to convert the control voltage into an output oscillation; and a feedback module operably coupled to produce the feedback oscillation from the output oscillation, wherein the loop filter includes:

a first resistor having a first node and a second node, wherein the first node is operably coupled to receive the charge pump signal;

a first capacitor having a first node and a second node, wherein the first node of the first capacitor is operably coupled in series with the second node of the first resistor, wherein the second node of the first capacitor is coupled to a return, wherein the first capacitor is of a first capacitor construct having a first quality factor;

a second capacitor operably coupled in parallel to the series connection of the first resistor and the first capacitor, wherein the second capacitor is of a second capacitor construct having a second quality factor, wherein the second quality factor is greater than the first quality factor;

a third capacitor operably coupled in parallel with the second capacitor, wherein the third capacitor is of third capacitor construct having a third quality factor, wherein the third quality factor is greater than the second quality factor;

a second resistor having a first node and a second node, wherein the first node of the second resistor is operably coupled to the first node of the first resistor; and a fourth capacitor having a first node and a second node, wherein the first node of the fourth capacitor is coupled to the second node of the second resistor to provide the control voltage, wherein the second node of the fourth capacitor is coupled to the return, wherein the fourth capacitor is of the third capacitor construct having the third quality factor.

12. The on-chip phase locked loop of claim 11 further comprises:

the first capacitor having a first die area to capacitance ratio;

the second capacitor having a second die area to capacitance ratio; and the third capacitor and fourth capacitors have a third die area to capacitance ratio, wherein the third die area to capacitance ratio is greater than the second die area to capacitance ratio, which is greater than the first die area to capacitance ratio.

13. The on-chip phase locked loop of claim 11 further comprises at least one of:

the first resistor including a variable resistance structure; and the second resistor including a second variable resistance structure.

14. The on-chip phase locked loop of claim 11 further comprises at least one of:

the first capacitor including a variable capacitive structure;

the second capacitor including a second variable capacitive structure;

the third capacitor including a third variable capacitive structure; and the fourth capacitor including a fourth variable capacitive structure.

15. The on-chip phase locked loop of claim 11, wherein the third capacitor construct comprises a metal fringe capacitor structure.

16. The on-chip phase locked loop of claim 11, wherein the second capacitor construct comprises a plurality of MOS (Metal Oxide Semiconductor) transistors, wherein each of the plurality of MOS transistors has a narrow channel length.

17. The on-chip phased locked loop of claim 11, wherein the third capacitor construct comprises a plurality of MOS (Metal Oxide Semiconductor) transistors, wherein each of the plurality of transistors has a wide channel length.

18. The on-chip phased locked loop of claim 11 further comprises:

the second capacitor fabricated on a first metal layer; and the third capacitor fabricated on a second metal layer, wherein the second capacitors substantially overlays the third capacitor.

19. The on-chip phased locked loop of claim 11 further comprises:

a ground plane fabricated to shield the first resistor, the first capacitor, the second capacitor, and the third capacitor.

20. The on-chip phased locked loop of claim 11 further comprises:

the second resistor and the fourth capacitor fabricated proximal to an input of a voltage controlled oscillator.

21. A radio frequency integrated circuit (RFIC) comprises:

a receiver section operably coupled to convert inbound radio frequency (RF) signals into inbound baseband signals in accordance with a receiver local oscillation;

a transmitter section operably coupled to convert outbound baseband signals into output RF signals in accordance with a transmitter local oscillation; and a local oscillation module operably coupled to produce the receiver local oscillation and the transmitter local oscillation, wherein the local oscillation module includes:

an oscillation comparator operably coupled to compare a reference oscillation with a feedback oscillation to determine at least one of a phase difference and a frequency difference;

a charge pump operably coupled to convert the at least one of the phase difference and the frequency difference into a charge pump signal;

a loop filter operably coupled to convert the charge pump signal into a control voltage;

a voltage controlled oscillator operably coupled to convert the control voltage into an output oscillation, wherein the receiver local oscillation and the transmitter local oscillation are derived from the output oscillation; and a feedback module operably coupled to produce the feedback oscillation from the output oscillation, wherein the loop filter includes:

a first resistor having a first node and a second node, wherein the first node is operably coupled to receive the charge pump signal;

a first capacitor having a first node and a second node, wherein the first node of the first capacitor is operably coupled in series with the second node of the first resistor, wherein the second node of the first capacitor is coupled to a return, wherein the first capacitor is of a first capacitor construct having a first quality factor;

a second capacitor operably coupled in parallel to the series connection of the first resistor and the first capacitor, wherein the second capacitor is of a second capacitor construct having a second quality factor, wherein the second quality factor is greater than the first quality factor;

a third capacitor operably coupled in parallel with the second capacitor, wherein the third capacitor is of third capacitor construct having a third quality factor, wherein the third quality factor is greater than the second quality factor;

a second resistor having a first node and a second node, wherein the first node of the second resistor is operably coupled to the first node of the first resistor; and a fourth capacitor having a first node and a second node, wherein the first node of the fourth capacitor is coupled to the second node of the second resistor to provide the control voltage, wherein the second node of the fourth capacitor is coupled to the return, wherein the fourth capacitor is of the third capacitor construct having the third quality factor.

22. The RFIC of claim 21 further comprises:

the first capacitor having a first die area to capacitance ratio;

the second capacitor having a second die area to capacitance ratio; and the third capacitor and fourth capacitors have a third die area to capacitance ratio, wherein the third die area to capacitance ratio is greater than the second die area to capacitance ratio, which is greater than the first die area to capacitance ratio.

23. The RFIC of claim 21 further comprises at least one of:

the first resistor including a variable resistance structure; and the second resistor including a second variable resistance structure.

24. The RFIC of claim 21 further comprises at least one of:

the first capacitor including a variable capacitive structure;

the second capacitor including a second variable capacitive structure;

the third capacitor including a third variable capacitive structure; and the fourth capacitor including a fourth variable capacitive structure.

25. The RFIC of claim 21, wherein the third capacitor construct comprises a metal fringe capacitor structure.

26. The RFIC of claim 21, wherein the second capacitor construct comprises a plurality of MOS (Metal Oxide Semiconductor) transistors, wherein each of the plurality of MOS transistors has a narrow channel length.

27. The RFIC of claim 21, wherein the third capacitor construct comprises a plurality of MOS (Metal Oxide Semiconductor) transistors, wherein each of the plurality of transistors has a wide channel length.

28. The RFIC of claim 21 further comprises:

the second capacitor fabricated on a first metal layer; and the third capacitor fabricated on a second metal layer, wherein the second capacitors substantially overlays the third capacitor.

29. The RFIC of claim 21 further comprises:

a ground plane fabricated to shield the first resistor, the first capacitor, the second capacitor, and the third capacitor.

30. The RFIC of claim 21 further comprises:

the second resistor and the fourth capacitor fabricated proximal to an input of a voltage controlled oscillator.

* * * * *